United States Patent

Hershey et al.

[11] Patent Number: 5,825,808
[45] Date of Patent: Oct. 20, 1998

[54] RANDOM PARITY CODING SYSTEM

[75] Inventors: John Erik Hershey, Ballston Lake; Jerome Johnson Tiemann, Schenectady, both of N.Y.

[73] Assignee: General Electric Company, Schenectady, N.Y.

[21] Appl. No.: 628,047

[22] Filed: Apr. 4, 1996

[51] Int. Cl.[6] .............................. H04L 1/00; H03M 13/00; H04B 1/69
[52] U.S. Cl. ............................... 375/200; 371/30; 341/94
[58] Field of Search ........................... 375/200, 206, 375/377; 371/30, 37.01, 37.06, 38.1; 341/94

[56] References Cited

U.S. PATENT DOCUMENTS

| 4,328,582 | 5/1982 | Battail et al. | 371/37.06 |
| 5,237,615 | 8/1993 | Snow | 380/47 |

OTHER PUBLICATIONS

Lin, S., and Costello, D.J., Error Control Coding. Englewood Cliffs, NJ: Prentice–Hall, Inc., 1983, pp. 51–53.
"Data Transportation and Protection" by J.E. Hershey, R.K. Rao Rocky Yarlagadda, Plenum Press, New York, N.Y. (1986), pp. 18–20.
"Code Combining—A Maximum–Likelihood Decoding Approach for Combining an Arbitrary Number of Noisy Packets" by D. Chase, IEEE Trans. on Commun., vol. COM–33, No. 5, pp. 385–393 (1985).
"The Theory of Error–Correcting Codes" by F.J. MacWilliams and N.J.A. Sloane, 1977—pp. 44–45.

*Primary Examiner*—Stephen Chin
*Assistant Examiner*—Jeffrey W. Gluck
*Attorney, Agent, or Firm*—Lawrence P. Zale; Marvin Snyder

[57] ABSTRACT

An encoder functions to perform a modulo-two dot product of an n-bit information word with a succession of n-bit projector words which are n-bit words chosen at random or generated pseudorandomly. These projectors are also known by the decoder. The parity of the successive dot products is sent as the output bits of the coder. The decoder receives the incoming bits which have been generated at the encoder and subsequently passed through a noisy channel. In the decoder, the projectors serve as successive n-bit addresses to a table. If the incoming i-th bit is a zero, the content of the indicated table location is incremented. If the incoming bit is a one, the content is decremented. After the table has been filled, the table contents are considered as a vector, V. The Hadamard transform is then taken. The largest (most positive) coefficient of the transform is identified. The table address corresponding to the location of the largest coefficient is the estimate of the decoded information word.

8 Claims, 4 Drawing Sheets

RANDOM PARITY CODING SYSTEM

BACKGROUND OF THE INVENTION

1. Field of the Invention

The present invention relates to electronic communication of digital messages, and more particularly, to communicating these messages in a high noise environment.

2. Description of Related Art

Many communication environments are extremely noisy. The communication channel may become quite complex, involving a mix of random impulses, Gaussian noise, and frequency selective fading. Such "unfriendly channels" will become ever more commonplace as more communication is employed in factories and near heavy machinery. Sometimes it is not possible to use conventional error detection and/or correction techniques with the high error rates encountered.

Fortunately, there is not a great deal of information transmitted in these noisy channels, and the encoding need be robust rather than efficient.

In many cases, repetition coding is used as a stand-alone encoding or with other encoding schemes. Repetition coding is extremely inefficient, and possibly may be replaced with another robust, but more efficient encoding scheme.

Currently, there is a need for a more efficient low-rate coding system to communicate digital messages in high-noise environments.

SUMMARY OF THE INVENTION

A system for communication of digital message words $c=(c_1, c_2, c_3, \ldots c_n)$ through a high noise channel employs a projector memory for storing m pseudorandom projector words each being n bits long.

A modulo-2 dot product performs a modulo-2 dot product of each projector word with said message word to create a plurality of dot product bits passed to a channel driver. The channel driver transmits the dot product bits through the channel.

At the other end of the channel, a receiver for decoding a digital message word $c=(c_1, c_2, c_3, \ldots c_n)$ employs a channel receiver for demodulating the signal passed through the channel.

A router is coupled to a projector memory having m projector words each n bits long. The router receives the projector words from the projector memory and uses each as an address of a location in the vector memory. It then routes a bit of the demodulated signal to that location of the vector memory.

The router then increments the content of memory location of the vector memory addressed for one bit value, and decrements that memory location content for the other bit value for each bit value of the word.

A transform device is coupled to the vector memory for performing a Hadamard transform of the contents of the vector memory to produce $2^n$ transformed values in an indexed order.

A selection device determines the largest transformed value, and uses the index of this largest transformed value as the decoded message word c.

Optionally, a weighting device may be inserted between the router and vector memory. The channel receiver must be capable of determining channel quality for each demodulated word of the received signal. It passes a measure of this channel quality to the weighting device. The weighting device determines a multiplier factor and multiplies the amount by which the router will increment or decrement the locations of the vector memory, causing the locations to be updated reflecting the channel quality, and the certainty of the received signal.

OBJECTS OF THE INVENTION

It is an object of the present invention to provide a low-rate coding system to communicate digital messages which operates in high-noise environments.

It is another object of the present invention to provide a more efficient digital communication scheme for use in high-noise environments.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION OF THE INVENTION

Figure 1:
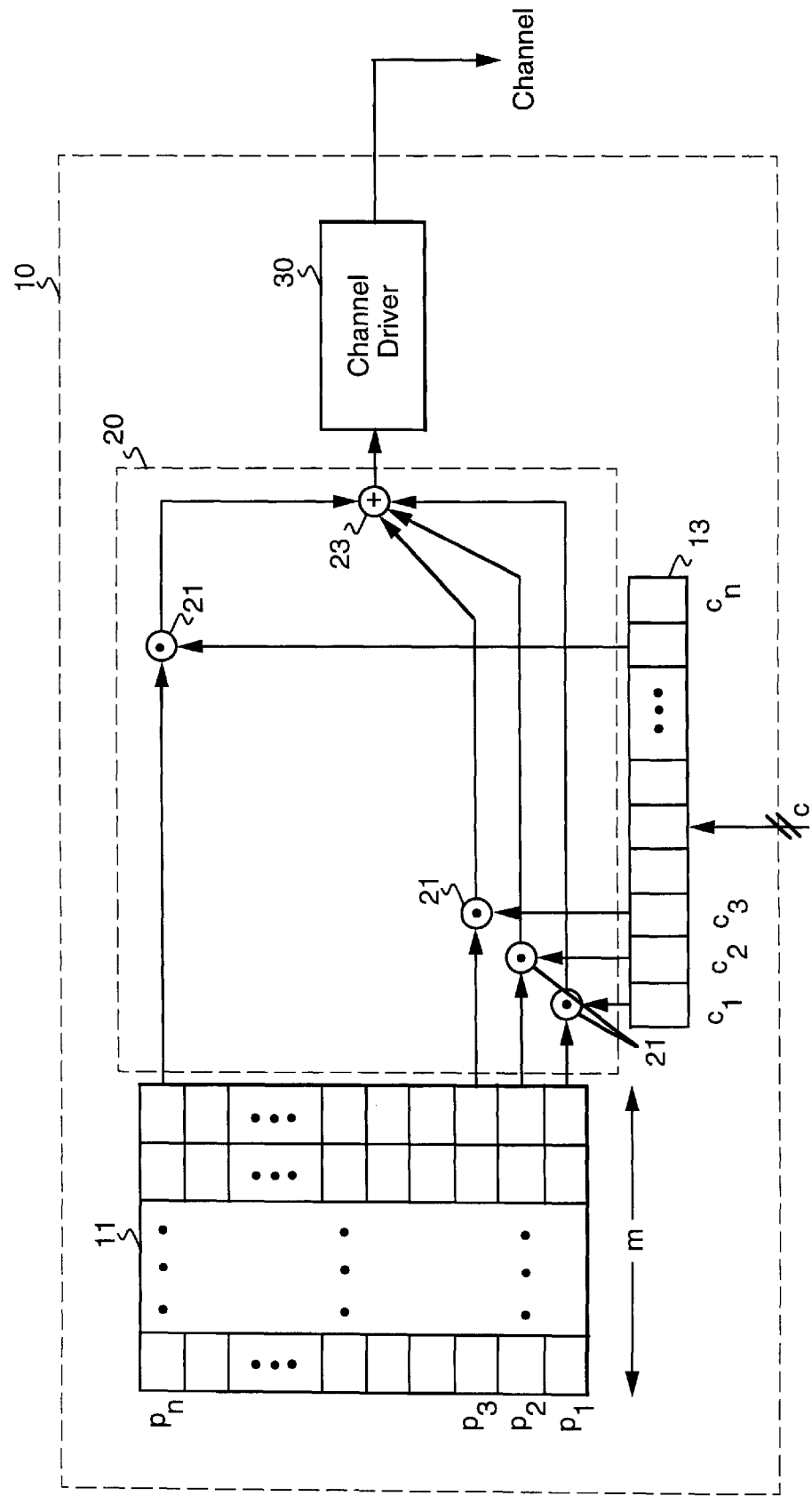
FIG. 1 is a simplified block diagram of transmitter according to the present invention.

In FIG. 1 a transmitter 10 is shown having a message register 13 for storing a digital message word $C=(c_1, c_2, c_3, \ldots c_n)$ desired to be transmitted to a receiver. A projector memory 11 holds m projector words, each being n bits long.

AND gates 21 each receive a bit from the projector memory 11 and a corresponding bit from message register 13 and perform a logical AND to result in a bit which is passed to a modulo-2 summation device 23. Modulo-2 summation device 23 performs a modulo-2 summation of the bits provided to it to produce an encoded bit passed to a channel driver 30. Channel driver 30 passes the encoded bit through a channel.

Together AND gates 21 and summation device 23 comprise a dot product device 20 which effectively performs a modulo-2 dot product of the message word and the projector word.

Figure 2:
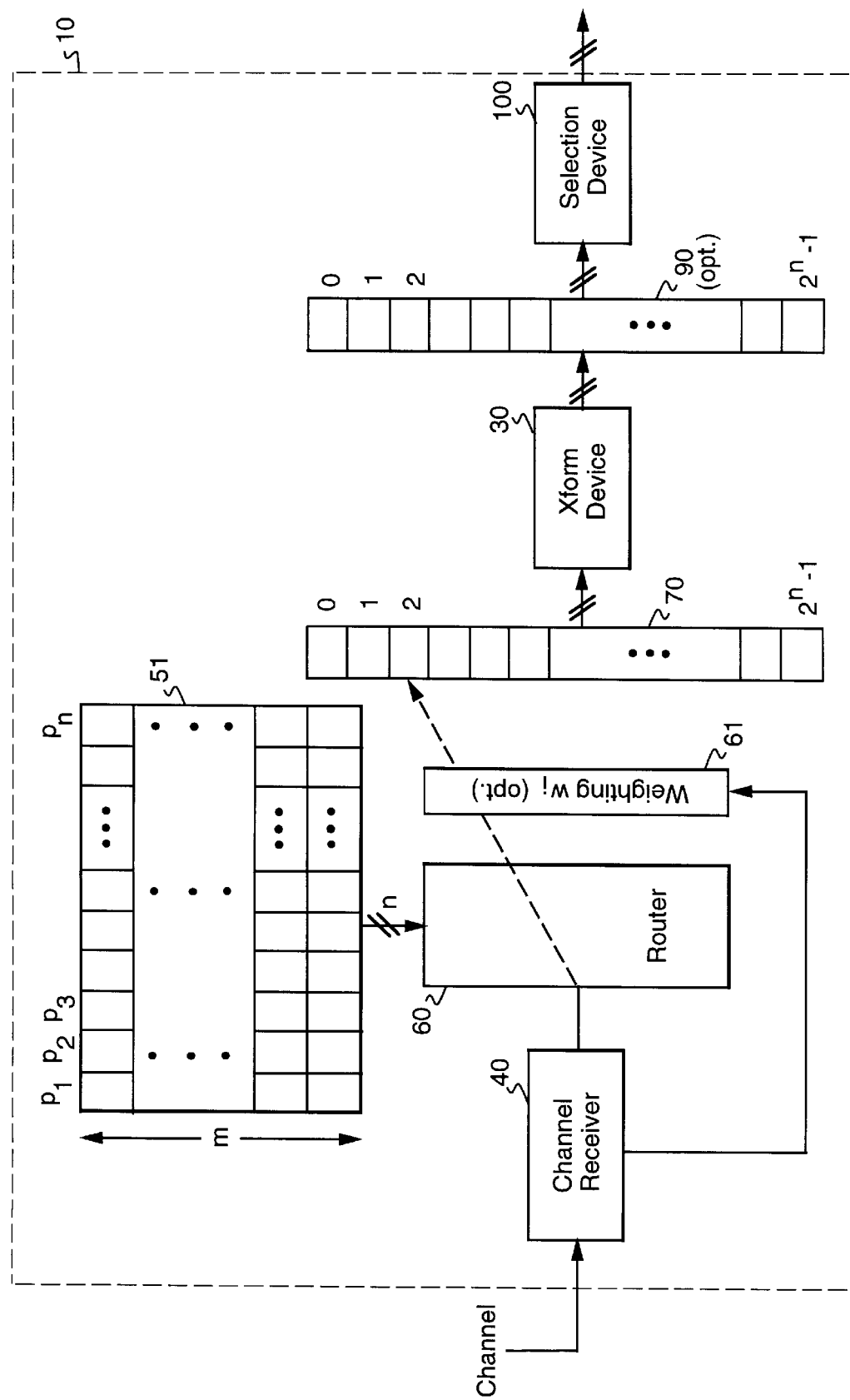
FIG. 2 is a simplified block diagram of receiver according to the present invention.

In FIG. 2, a receiver 50 is shown employing a channel receiver device 40 which receives the encoded bits transmitted through the channel. A projector memory 51 holds m projector words, each being n bits long, just as in projector memory 11 of transmitter 10.

A router 60 receives the encoded bits and the projector words from projector memory 51. Router 60 uses the projector words as addresses into a vector memory 70 having at least $2^n$ memory locations. A value in the memory location pertaining to the current projector word is incremented if the current encoded bit is a "0" and decremented if the current encoded bit is a "1". Router 60 performs its functions for a plurality of received encoded bits and their corresponding projector words. The vector memory 70 is "cleared"—set to all zeros—before processing each string of m bits.

A transform device, ("xform device") 80 reads the resulting values stored in vector memory 70, and performs a transform of the values to result in transformed values, which may be stored in a transform memory 90. Transform memory 90 may be a section of vector memory 70, or a separate memory. The transformed values may also be stored in vector memory 70 replacing the values previously there. Xform device 80 performs a (Sylvester-type) Hadamard transform, such as described in "The Theory of Error-Correcting Codes" pp. 44–45 by F. J. MacWilliams, N. J. A. Sloane, Bell Labs, Murry Hill, N.J., North-Holland Publishing Co., New York City, which may be implemented by a number of conventional methods, including the Fast Hadamard Transform. It also may be performed in software, hardware, or a mix of both.

A selection device 100 either reads the transformed values from transform memory 90 or directly receives the transformed values from transform device 80 and determines the largest transformed value, and the address associated with the largest transformed value. This <u>address</u> (in normal binary) is then the decoded message word c.

The operation of the present invention may be more clearly understood by walking through an example using data.

Assume that the channel is a binary symmetric channel (BSC) with an error probability $\rho$. $C_\rho$ is the capacity of the channel. The number of projectors used, m, is defined according to the following formula:

$$m = f_{ceil}\left(\alpha \frac{n}{C_\rho}\right) \quad (1)$$

where $$C_\rho = 1 + \rho lg_2 \rho + (1-\rho)lg_2(1-\rho); \quad (2)$$

and $f_{ceil}$ is the ceiling function being the smallest integer, larger than, or equal to its argument. $lg_2$ is the log function to base "2". $\alpha$ is a newly defined term which is measure of redundancy in the transmission signal. Typically $\alpha$ is between 2 and 2.5.

Arbitrarily choosing n=3, $\rho$=0.2, and $\alpha$=2, for illustration purposes, and substituting these into Eq. (1) results in m=22, indicating that there are to be 22 projector words employed. $(c_1, c_2, c_3)$=(1, 1, 0) is arbitrarily selected as the message word to be transmitted through the channel. Twenty-two words are synthesized which are shown in Table 1.

TABLE 1

| PROJECTOR WORDS | | | OUTPUT BIT |
|---|---|---|---|
| 1 | 1 | 1 | 0 |
| 0 | 0 | 1 | 0 |
| 0 | 0 | 1 | 0 |
| 1 | 0 | 0 | 1 |
| 1 | 0 | 0 | 1 |
| 0 | 1 | 1 | 1 |
| 1 | 1 | 1 | 0 |
| 1 | 1 | 0 | 0 |
| 0 | 1 | 0 | 1 |
| 0 | 1 | 0 | 1 |
| 0 | 0 | 1 | 0 |
| 1 | 0 | 0 | 1 |
| 1 | 0 | 1 | 1 |

TABLE 1-continued

| PROJECTOR WORDS | | | OUTPUT BIT |
|---|---|---|---|
| 1 | 0 | 0 | 1 |
| 0 | 1 | 0 | 1 |
| 1 | 0 | 0 | 1 |
| 1 | 0 | 0 | 1 |
| 1 | 0 | 1 | 1 |
| 0 | 1 | 1 | 1 |
| 0 | 0 | 1 | 0 |
| 0 | 1 | 0 | 1 |
| 1 | 1 | 1 | 0 |

By performing a dot product of the projector words and the message word results in the encoded output bits "0001100110111111111010" as shown in Table 1.

In decoder 50, the projector words designate the vector memory locations which are to be incremented or decremented if the received bit is a zero or one, respectively.

Table 2 shows the projector words, being the same as those used by transmitter 10, the table addresses specified by the projector words, and the appropriate action, being either increment (inc.) the value of that location, or decrement (dec.), as determined by each encoded bit.

TABLE 2

| PROJECTOR WORDS | | | ADDRESS/ACTION |
|---|---|---|---|
| 1 | 1 | 1 | 7/inc. |
| 0 | 0 | 1 | 1/inc. |
| 0 | 0 | 1 | 1/inc. |
| 1 | 0 | 0 | 4/dec. |
| 1 | 0 | 0 | 4/dec. |
| 0 | 1 | 1 | 3/dec. |
| 1 | 1 | 1 | 7/inc. |
| 1 | 1 | 0 | 6/inc. |
| 0 | 1 | 0 | 2/dec. |
| 0 | 1 | 0 | 2/dec. |
| 0 | 0 | 1 | 1/inc. |
| 1 | 0 | 0 | 4/dec. |
| 1 | 0 | 1 | 5/dec. |
| 1 | 0 | 0 | 4/dec. |
| 0 | 1 | 0 | 2/dec. |
| 1 | 0 | 0 | 4/dec. |
| 1 | 0 | 0 | 4/dec. |
| 1 | 0 | 1 | 5/dec. |
| 0 | 1 | 1 | 3/dec. |
| 0 | 0 | 1 | 1/inc. |
| 0 | 1 | 0 | 2/dec. |
| 1 | 1 | 1 | 7/inc. |

Values of locations having addresses defined by the projector words within vector memory 70 are updated according to the action specified in the last column of Table 2. Thus, for example, table address 1 of the table is set to 4 as there are 4 occurrences of 1/inc. and no occurrences of 1/dec. The state of vector memory 70 subsequent to receiving and processing all of the twenty-two encoded bits is shown in Table 3, being, in this example, an 8×1 vector V.

TABLE 3

| TABLE ADDRESS | CONTENTS (V) |
|---|---|
| 0 | 0 |
| 1 | +4 |
| 2 | -4 |
| 3 | -2 |
| 4 | -6 |
| 5 | -2 |

TABLE 3-continued

| TABLE ADDRESS | CONTENTS (V) |
|---|---|
| 6 | +1 |
| 7 | +3 |

The Hadamard Transform, of the 8×1 vector, V, is defined as $\mathcal{H}=H_3V$, resulting in a transformed vector $\mathcal{H}$.

$$\mathcal{H} = \begin{pmatrix} +1 & +1 & +1 & +1 & +1 & +1 & +1 & +1 \\ +1 & -1 & +1 & -1 & +1 & -1 & +1 & -1 \\ +1 & +1 & -1 & -1 & +1 & +1 & -1 & -1 \\ +1 & -1 & -1 & +1 & +1 & -1 & -1 & +1 \\ +1 & +1 & +1 & +1 & -1 & -1 & -1 & -1 \\ +1 & -1 & +1 & -1 & -1 & +1 & -1 & +1 \\ +1 & +1 & -1 & -1 & -1 & -1 & +1 & +1 \\ +1 & -1 & -1 & +1 & -1 & +1 & +1 & -1 \end{pmatrix} \begin{pmatrix} 0 \\ +4 \\ -4 \\ -2 \\ -6 \\ -2 \\ +1 \\ +3 \end{pmatrix} = \begin{pmatrix} -6 \\ -12 \\ -2 \\ -4 \\ +2 \\ +0 \\ +22 \\ 0 \end{pmatrix} \quad (3)$$

There is a "fast" algorithm for performing this transform, which will be discussed later.

The largest coefficient of $\mathcal{H}$ is the value +22. This corresponds to location 7 (table address 6). 6 has a binary equivalent of (1, 1, 0,) and is then the estimate of the transmitted message word, $c=(c_1,c_2,c_3)$.

Transmission Errors

The effect of channel errors on the decoding system of the present invention is now examined. Assume that five encoded bits out of the twenty-two encoded bits sent were received incorrectly due to the noise within the channel. Let these bits be identified in boldface as indicated in Table 4.

TABLE 4

| No Errors | 0 0 0 1 1 1 0 0 1 1 0 1 1 1 1 1 1 1 0 1 0 |
|---|---|
| Errors | 0 1 0 1 1 1 1 1 1 1 0 1 0 1 1 1 1 1 0 0 1 0 |

The effects of the five transmission errors are reflected in the contents of vector memory 70, vector V, as depicted in Table 5.

TABLE 5

| TABLE ADDRESS | CONTENTS |
|---|---|
| 0 | 0 |
| 1 | +2 |
| 2 | -4 |
| 3 | 0 |
| 4 | -6 |
| 5 | 0 |
| 6 | -1 |
| 7 | +1 |

The errors change the Hadamard Transform coefficients, and we find that:

$$\mathcal{H} = H_3V = \begin{pmatrix} -8 \\ -14 \\ 0 \\ -2 \\ +4 \\ +2 \\ +12 \\ +6 \end{pmatrix} \quad (4)$$

The largest coefficient of $\mathcal{H}$ is the value +12. Notice that the largest coefficient still identifies the correct code word although the coefficient's value has been reduced by 10 which is a value equal to twice the number of errors in our example.

Fast Hadamard Transform

One practical method for implementing the decoder in xform device 80 is to employ the Fast Hadamard Transform (FHT), as described in "Data Transportation and Protection" by John E. Hershey, R. K. Rao Yarlagadda, pp. 18–20, Plenum Press, New York, N.Y. (1986).

Since only additions and subtractions are involved in the FHT computation, the FHT can be easily and quickly implemented with a general purpose microprocessor or in gate array logic.

Simulation

Figure 3:
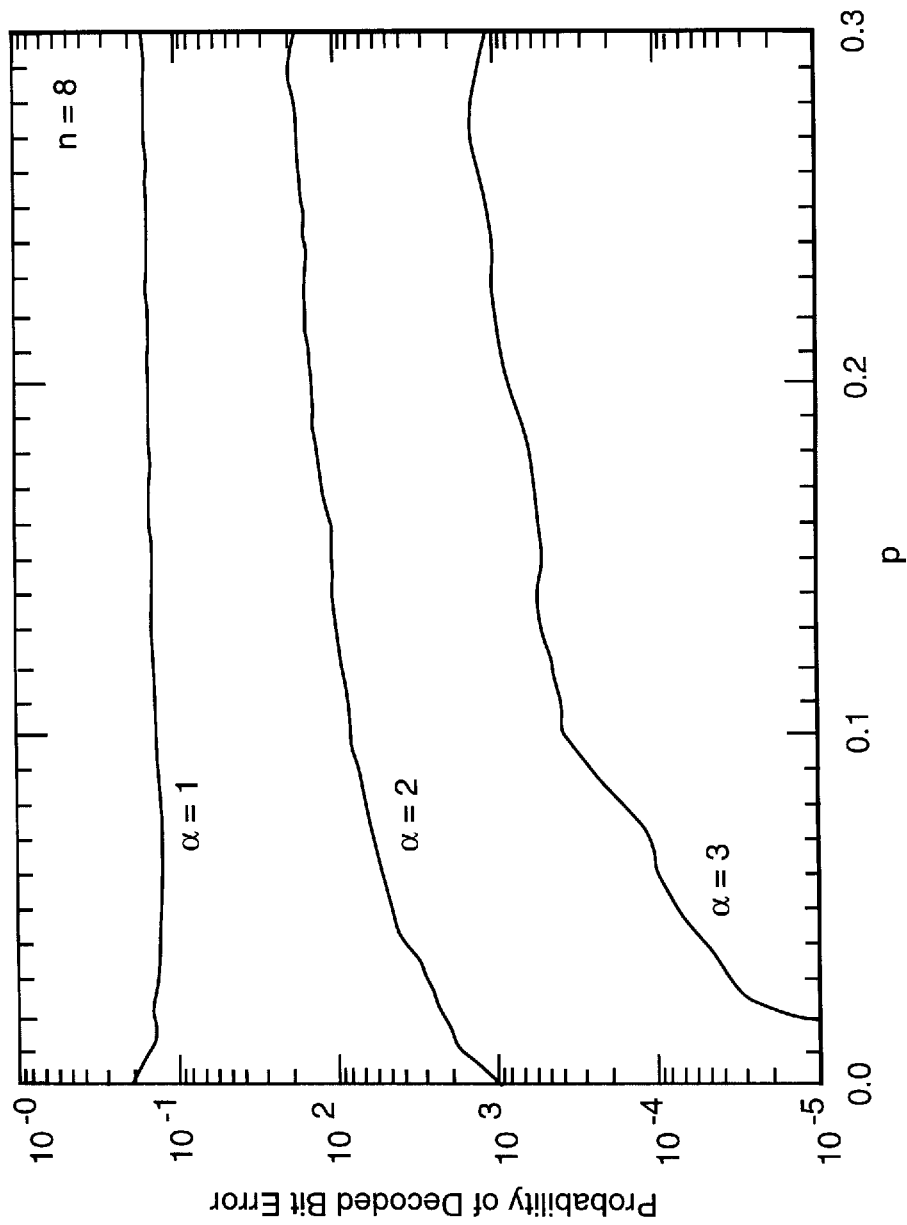
FIG. 3 is a graph of a simulation of probability of a decoded message bit error versus the error probability associated with a channel for a redundancy measure $\alpha$ of 1, 2, and 3.

FIG. 3 presents smoothed data resulting from a simulation for n=8 and α=1,2,3. Finally, it is expected that the efficacy (and decoding complexity) of Random Parity Coding grows with increasing n.

Soft Decoding

For spread spectrum applications, each bit may be broken up and merged with "chips", or other bits of a spreading code being merged with the message bits but at a higher rate, to cause a signal to be created with a wide transmission spectrum.

The "voting" at the receiver in which the contents of a location of memory 70 may be incremented or decremented may be a weighted function of the certainty of the data. A measure of the channel quality is used to weight each "vote" such that more weight is given to decoded information when the channel is good and little or no weight given to the information when the channel is bad.

If a code word bit is sent by a direct sequence spread spectrum system using, say, N chips per bit, then the crosscorrelator's final value, $v_f$, where $-N \leq v_f \leq +N$, may be used in estimating the code word bit error probability.

For a BSC channel with error probability, ρ, such an estimate may be very useful in decreasing the probability of decoded bit error.

A weighting $w_i$, proposed in "Code Combining—A Maximum-Likelihood Decoding Approach for Combining an Arbitrary Number of Noisy Packets" by D. Chase, *IEEE Trans. on Commun.*, Vol. COM-33, No. 5, pp. 385–393 (1985) is assigned to bit i. This weighting may be:

$$w_i = \ln\left(\frac{1-\rho_i}{\rho_i}\right), \quad (5)$$

where $\rho_i$ is the probability of error during reception of bit i.

The weighting of Eq. (5) may optionally be implemented in the receiver of FIG. 2, by a weighting device 61. A channel quality estimation is computed by channel receiver 40 and provides this information to weighting device 61. Weighting device 61 then increments, or decrements the contents of the memory location pointed to by the projector word by the weighted amount, to effectuate soft decoding.

Figure 4:
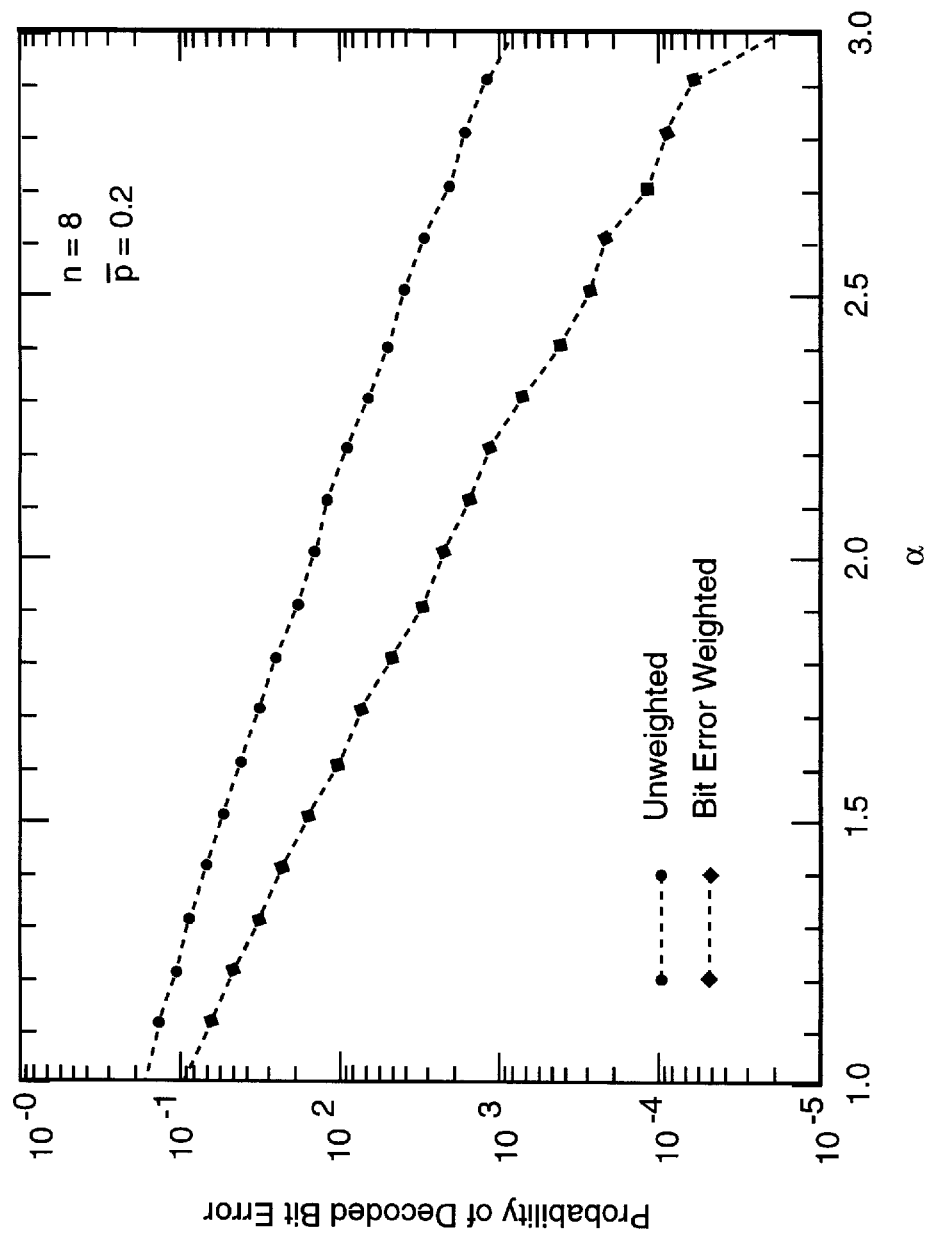
FIG. 4 is a graph of the results of a simulation of probability of a decoded message bit versus redundancy measure $\alpha$ with (Bit Error Weighted) Soft Decoding compared with Unweighted (or Equally Weighted) bit decisions.

The results displayed in FIG. 4 were produced using weight $w_i$ and assuming that ρ was memoryless and uniformly distributed over the range $0 \leq \rho \leq 0.4$ for each code word bit. It was also assumed that $\rho = \rho_i$ could be estimated for each code word bit.

As the data of FIG. 4 discloses, soft decoding may provide a great advantage if bit error estimation can be accurately obtained at low complexity.

While several presently preferred embodiments of the novel invention have been described in detail herein, many modifications and variations will now become apparent to those skilled in the art. It is, therefore, to be understood that the appended claims are intended to cover all such modifications and variations as fall within the true spirit of the invention.

What we claim is:

1. A digital communication transmitter for communicating a digital message word $c=(c_1,c_2,c_3,\ldots c_n)$ through a high noise channel comprising:
   a) projector memory for storing m pseudorandom projector words each being n bits long;
   b) a modulo-2 dot product device for receiving said message word and the projector words and performing a modulo-2 dot product of each projector word with said message word to create dot product bits;
   c) a channel driver coupled to the modulo-2 dot product for passing the dot product bits through said channel.

2. The digital communication transmitter of claim 1 wherein the modulo-2 dot product comprises:
   a) a plurality of logical AND devices which perform a logical AND of corresponding bits of the projector word and the message word; and
   b) a modulo-2 summation device which adds the bits it receives in a modulo-2 fashion.

3. A digital communication receiver for decoding a digital message word $c=(c_1,c_2,c_3,\ldots c_n)$ encoded in a signal passed through a high noise channel comprising:
   a) a channel receiver for receiving said signal from the channel;
   b) a projector memory for storing m pseudorandom projector words each being n bits long, being the same as those used to create encode the message word;
   c) a vector memory having $2^n$ addressable memory locations each capable of storing a number;
   d) a router coupled to the projector memory, and the vector memory, for receiving the projector words and said received signal, for using each projector word as an address of the vector table, and for incrementing the content of the memory location of the vector memory addressed for one bit value, and decrementing the content of that location for another bit value;
   e) a transform device coupled to the vector memory for performing a Hadamard transform of the contents of the vector memory to produce $2^n$ transformed values in an indexed order; and
   f) a selection device for determining the largest transform value, and using the binary representation of the index of this largest transformed value as the decoded message word c.

4. The digital communication receiver of claim 3 further comprising a weighting device coupled to the router, vector memory device, and channel receiver, for receiving a measure of quality of the received signal and multiplying the amount which the router increments or decrements the contents of the locations of the vector memory by a weighting factor related to the signal quality.

5. The digital communication receiver of claim 3 further comprising a transform memory having $2^n$ addressable memory locations each capable of storing a transformed value.

6. A method of transmitting a digital message word $c=(c_1,c_2,c_3,\ldots c_n)$ through a high noise channel comprising the steps of:
   a) acquiring m pseudorandom projector words each being n bits long;
   b) performing a modulo-2 dot product of each projector word with said message word c to create a plurality of dot product bits;
   c) passing the dot product bits through said channel.

7. A method for decoding a digital message word $c=(c_1,c_2,c_3,\ldots c_n)$ encoded in a signal passed through a high noise channel comprising the steps of:
   a) acquiring m pseudorandom projector words each being n bits long being the same as those used to encode message word c;
   b) receiving said encoded signal from said channel;
   c) decoding the received signal into a current decoded bit;
   d) selecting one of $2^n$ vector memory location with an address denoted by the next of m projector words as the current vector memory location;
   e) updating the current vector memory location content with the current decoded bit incrementing the current contents of the vector memory location for one bit value, and decrementing the current content for a second bit value;
   f) repeating steps "b"–"e" for a plurality of projector words;
   g) performing a Hadamard transform of the contents of the vector memory to produce $2^n$ transformed values in an indexed order; and
   h) selecting a largest transform value from the $2^n$ transformed values; and
   i) using the binary representation of the index of the largest transformed value as the decoded message word c.

8. The method for decoding a digital message word of claim 7 wherein the current vector memory location is updated by an amount proportional to the quality of the channel at the time the signal associated with the current decoded bit was received.

* * * * *